United States Patent [19]

Harland, Jr. et al.

[11] 3,821,780

[45] June 28, 1974

[54] DOUBLE MESA TRANSISTOR WITH INTEGRAL BLEEDER RESISTORS

[75] Inventors: Glen E. Harland, Jr.; Robert W. Metzger, Jr., both of Kokomo, Ind.

[73] Assignee: General Motors Corporation, Detroit, Mich.

[22] Filed: Oct. 24, 1972

[21] Appl. No.: 300,207

[52] U.S. Cl. .................... 357/36, 357/68, 357/40, 357/86, 357/56

[51] Int. Cl. ............................................ H01l 19/00

[58] Field of Search.. 307/315; 317/235 D, 235 AK, 317/235 AE

[56] References Cited

UNITED STATES PATENTS 3,624,454 11/1971 Adkinson et al. .................... 307/315

3,751,726 8/1973 Einthoven et al. .................. 307/315

3,755,722 8/1973 Harland et al. ..................... 317/235

*Primary Examiner*—Rudolph V. Rolinec
*Assistant Examiner*—William D. Larkins
*Attorney, Agent, or Firm*—Robert J. Wallace

[57] ABSTRACT

A high voltage and high current mesa type integrated circuit of cascaded common collector mesa emitter transistors and bleeder resistors that resist secondary breakdown. An integrated Darlington amplifier circuit is provided having an input emitter mesa which is an annulus surrounding an input transistor base region. An output transistor base region surrounds both the input emitter mesa and an output emitter mesa. In a preferred embodiment a third mesa is provided within the input transistor base region, to facilitate wire bonding to that region.

4 Claims, 4 Drawing Figures

DOUBLE MESA TRANSISTOR WITH INTEGRAL BLEEDER RESISTORS

BACKGROUND OF THE INVENTION

This invention relates to semiconductor devices and more particularly to integrated circuit devices of the mesa type. It is especially directed to mesa emitter integrated Darlington amplifiers having integral bleeder resistors.

Mesa type Darlington amplifiers can readily be constructed to possess a high energy capability with a low collector-emitter saturation voltage at high current levels. An emitter-base current path, through an appropriate resistance, is often provided in each transistor stage in a Darlington amplifier to bleed off leakage current that appears when the circuit is operated at higher temperatures. This gives the circuit higher temperature stability.

In mesa devices, the emitter-base and base-collector junctions do not terminate at the same surface of the device, as occurs in planar devices. Mesa devices can be made with a planar type emitter region or with a mesa emitter on a base mesa. This invention is directed to mesa emitter type devices.

Mesa devices can be used in a given circuit to allow the circuit to handle higher voltages. However, such devices cannot be readily integrated, since the usual integrated circuit technology is primarily directed to planar devices. Special techniques and processes have, therefore, been developed to facilitate incorporation of mesa type devices in an integrated circuit. One such special technique involves electrical isolation of discrete mesa devices in an integrated circuit that still permits one to use conventional mesa type triple diffusion technology to make the circuit. Isolation is achieved by the use of etch moats that circumscribe selected areas to be isolated. The etch moats extend down through the base-collector junction. This not only isolates devices but can be used to concurrently form a base region mesa. Unfortunately, such structures require jumper wires to electrically bridge the moats. Moreover, peculiar extended moat configurations may be needed to define integral resistors for the circuit, if the whole circuit is to be made by the conventional triple diffusion technology normally used to make mesa devices. Jumper wires are, of course, undesirable from a cost and reliability standpoint. Also, the length of exposed base-collector junction is increased by the extended moat configurations. This increases the probability for secondary breakdown of this junction, which limits the voltage capability for the circuit.

U.S. Pat. No. 3,624,454 Adkinson, et al., discloses an integrated mesa emitter type Darlington amplifier that has integral bleeder resistors formed with a reduced etch moat length and that does not require jumper wires. The Adkinson et al., device has a circumscribing etch moat, with short etch moats extending into the active area of the device to define integral resistor portions.

We described an improvement on this device in our recently filed U.S. Pat. application Ser. No. 292,979 entitled "Resistor Isolation for Double Mesa Transistors " now U.S. Pat. No. 3,755,722. In the improved device, the output emitter mesa is fully encircled by the output base region. The output emitter mesa does not, therefore, contact either the circumscribing etch moat or the device wafer edge. In a preferred embodiment of the improved device, the input emitter mesa does not intersect the circumscribing moat or wafer edge either. However, the preferred embodiment referred to requires use of oxide masking techniques, in addition to conventional triple diffusion processing. This, of course, contributes to increased manufacturing costs, which limits the applications in which the subject type of device can be used economically.

We have now found a new device geometry which provides the advantages of the preferred embodiment referred to but which does not require use of oxide masking techniques. It can be made using only the usual triple diffusion processing technology. Thus, an improved device can be produced at lower cost. In the new construction both the input and output emitter mesas are isolated from the circumscribing etch moat, without requiring oxide masking processing techniques. In addition, we have found a technique to facilitate making wire bonded terminal connections to our improved device.

OBJECTS AND SUMMARY OF THE INVENTION

An object of this invention is, therefore, to provide an improved mesa emitter type integrated Darlington amplifier with integral bleeder resistors.

A further object of the invention is to provide such a structure that can be made by the usual triple diffusion techniques in which neither the input emitter mesa nor the output emitter mesa intersects a circumscribing etch moat or wafer edge.

A still further object of the invention is to provide an improved integrated mesa emitter type Darlington amplifier with integral bleeder resistors having an input base mesa to which a base lead terminal wire can be bonded.

These and other objects of the invention are attained with a mesa emitter integrated Darlington amplifier having an input emitter mesa and an output emitter mesa, of one conductivity type on a base layer of opposite conductivity type. The input emitter mesa is an annulus which surrounds the input base enhancement region. Both mesas are completely surrounded by an output base enhancement region. A third emitter mesa can be provided within the input base section to facilitate bonding a filamentary terminal wire to the input base region.

DESCRIPTION OF THE DRAWING

Other objects, features and advantages of this invention will become more apparent from the following description of the preferred examples thereof and from the drawings, in which.

DESCRIPTION OF THE PREFERRED EMBODIMENT

Figure 1:
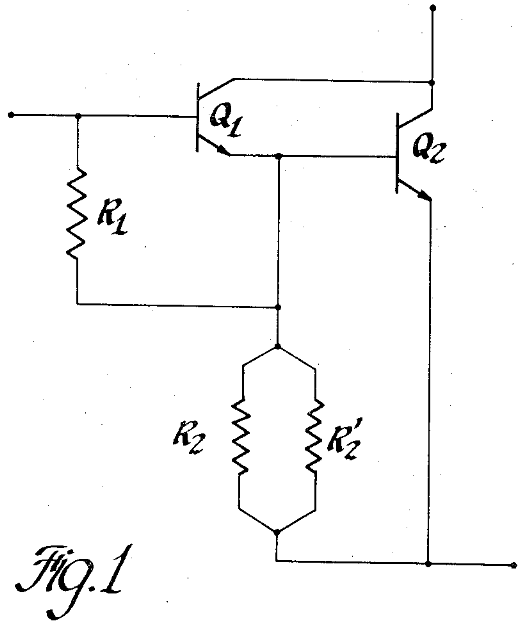
FIG. 1 is an electrical schematic showing a Darlington amplifier circuit having bleeder resistors.

As can be seen in connection with FIG. 1, this invention is particularly directed to an integrated Darlington amplifier having an input transistor $Q_1$ and an output transistor $Q_2$. It also includes a relatively high resistance input bleeder resistor $R_1$ for input transistor $Q_1$ and a relatively low resistance output bleeder resistor for output transistor $Q_2$. $R_1$ should have a greater resistance than $R_2$ to ensure that $Q_1$ will turn on before $Q_2$, and at the desired base drive. For higher voltage applications, $R_1$ can be about 100–600 ohms and $R_2$ about 10–150 ohms.

Figure 2:
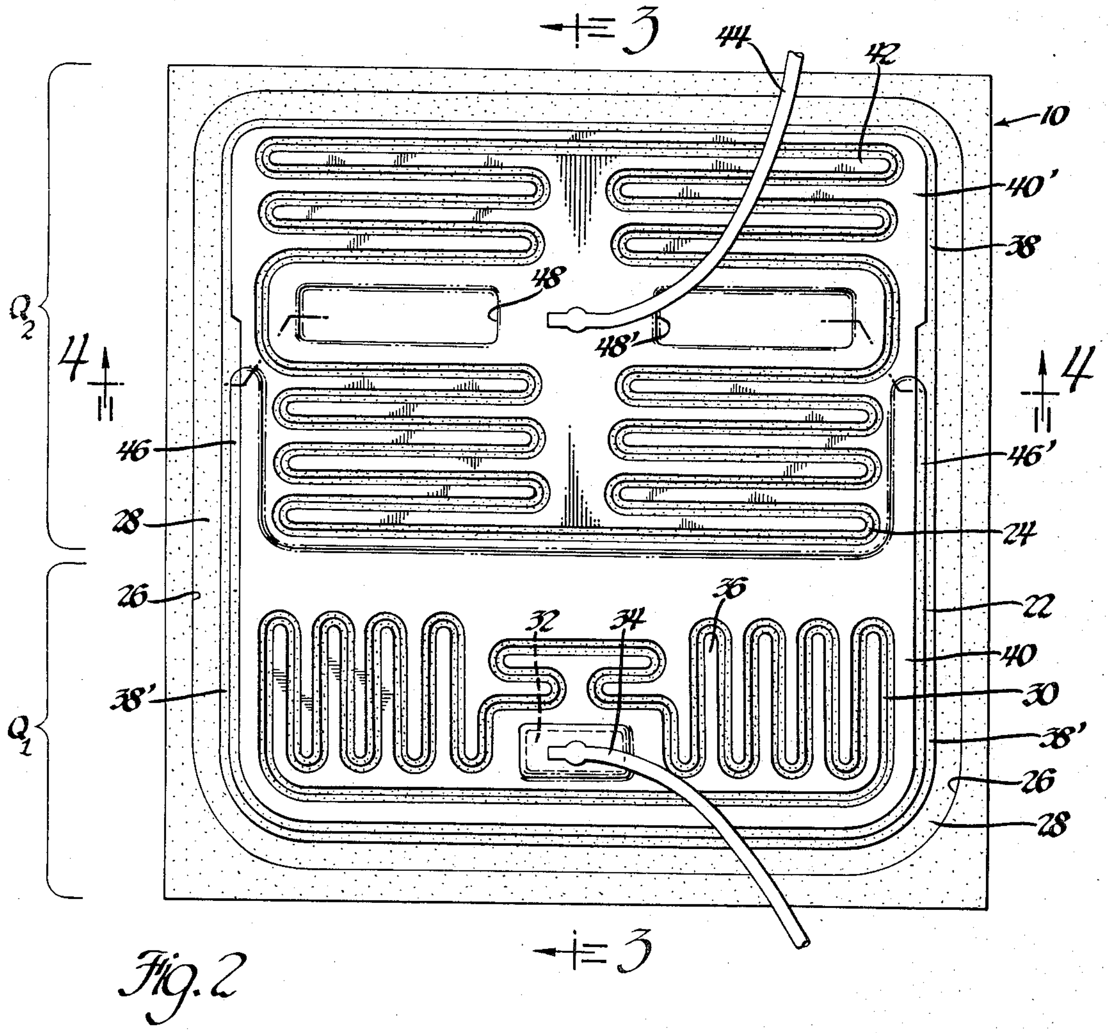
FIG. 2 is a plan view of an interdigitated mesa emitter type Darlington amplifier with integral bleeder resistors made in accordance with the invention.
Figure 3:
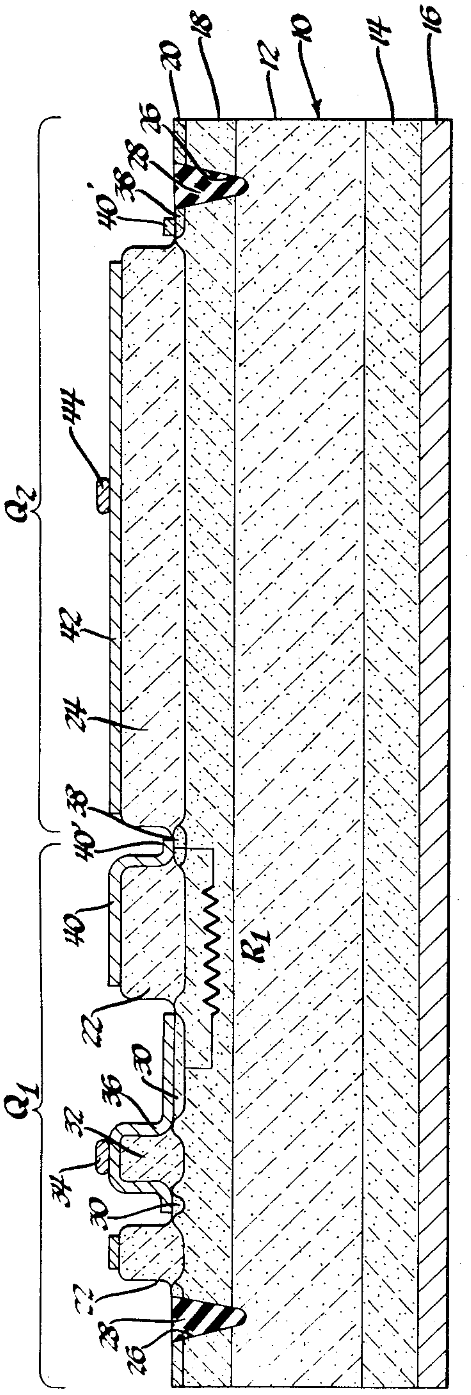
FIG. 3 is a sectional view along the line 3—3 of FIG. 2.
Figure 4:
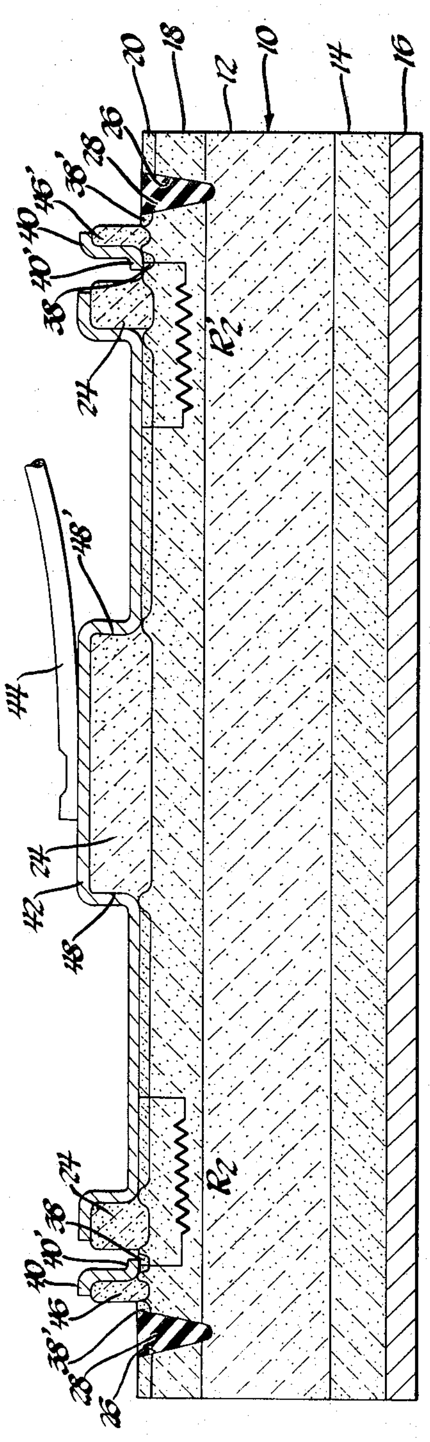
FIG. 4 is a sectional view on line 4—4 of FIG. 2.

The electrical schematic illustrated in FIG. 1 is embodied in the semiconductor device illustrated in FIGS. 2, 3 and 4. This device is similar in some respects to the mesa emitter integrated Darlington amplifier described in our recently filed U.S. Pat. application Ser. No. 16,753 entitled "Resistor Isolation for Double Mesa Transistors." It is similar in that it involves a high resistivity semiconductor wafer of one conductivity type, having a base layer stratum on one surface of the wafer of opposite conductivity type. The wafer has a lower resistivity layer on its opposite surface of the one conductivity type to reduce contact resistance to the wafer. The discrete emitter mesas of the one conductivity type are disposed on the surface of the base stratum with each emitter mesa having its own discrete base enhancement region. The base enhancement regions are spaced from one another, providing an integral input bleeder resistor therebetween through the underlying base stratum.

Our improved device differs, however, with respect to the shape and disposition of both the input emitter mesa and the input base enhancement region. It also differs with respect to the manner in which the output bleeder resistor is formed. Using peculiar geometries, conventional triple diffusion processing can be used to make this device without the emitter mesas intersecting the etch moat or wafer edge.

The device is formed on a wafer 10 of high resistivity N-type silicon. By high resistivity N-type silicon I mean a high purity silicon material that contains an N-type conductivity determining impurity at a concentration of less than about $10^{15}$ atoms per cubic centimeter of silicon. The wafer 10 has major surface dimensions of about 175 by 175 mils and is about 8.5 mils thick. It has a plurality of diffusion strata and regions which are shown in exaggerated thicknesses for purposes of illustration. The thickest of these is the undiffused original wafer material which forms a 4.0 mil thick central high resistivity N-type stratum 12. Central stratum 12 is of 0.5 – 100 ohm-centimeter N-type silicon. The lower surface of wafer 10 is formed by a lower resistivity N-type diffusion layer, or N+ stratum 14, about 0.9 mil thick and having a sheet resistance of about 0.48 ohm per square. This stratum is included to reduce contact resistance to stratum 12, and can be made by phosphorus diffusion. The N+ stratum 14 is convered with a metallic coating 16 to facilitate making a low resistance, ohmic connection to N+ stratum 14. Metallic coating 16 can be of nickel, solder, gold, etc.

The top surface of wafer 10 includes a P-type diffusion layer, or P-type stratum 18, and a shallower lower resistivity P-type diffusion layer 20 on selected portions of it. These layers can be formed by successive diffusion with impurities such as boron and aluminum. The shallower, lower resistivity layer 20 can be referred to as a P+ surface enhancement stratum. Stratum 18 is about 1.2 mils thick and has a sheet resistance at its interface with layer 20 of about 500 ohms per square. Surface enhancement stratum 20 is about 0.2 mil thick and has a sheet resistance of about 22 ohms per square.

N-type mesas 22, 24 and 32 upstand on the top surface of wafer 10. The first two mesas 22 and 24 provide emitter regions for input transistor $Q_1$ and output transistor $Q_2$, respectively. The third mesa 32 facilitates wire bonding to the input base region, as hereinafter described. Mesas 22, 24 and 32 are about 0.9 mil high and are doped by phosphorus or arsenic diffusions to a sheet resistance of about 0.48 ohm per square. A circumferential moat 26 encircles the device without contacting either mesa. As can be seen, moat 26 extends down through the surface layers 18 and 20 into the central stratum 12. Moat 26 is preferably filled with a passivating agent 28 such as a semiconductor grade room temperature vulcanizable rubber.

Input emitter mesa 22 is in essence interdigitated annulus surrounding an input base enhancement region 30, and intedigitated therewith. The input base portion encircled by input emitter mesa 22 is at a lower level than the top of emitter mesa 22. It is coplanar with the surface of the wafer formed by P+ stratum 20. Because of extensive interdigitation, there is little room for connecting a filamentary type terminal lead to the input base portion by conventional ultrasonic or thermocompression bonding techniques. The filamentary wire can contact the top adjacent emitter mesa 22 and cause an electrical short. Accordingly, a third discrete emitter mesa 32 is provided wholly within base section portion 30 upon which a filamentary wire 34 can be bonded. Mesa 32, being a discrete mesa, is not electrically connected to either of emitter mesas 22 or 24. A vacuum evaporated aluminum coating 36 covers both the base portion 30 and the third mesa 32, forming an interdigitated electrode for the input base portion 30. A filamentary terminal wire 34 is pressure bonded by ultrasonic or thermocompression bonding techniques to electrode 36 on top of mesa 32. Since electrode 36 extends down from the top of wafer 32 onto input base portion 30, terminal wire 34 is in low resistance electrical communication with input base portion 30.

Output emitter mesa 24 is surrounded by, and interdigitated with, output base portion 38. It is, therefore, spaced from both the etch moat 26 and the input emitter mesa 22. Output base portion 38 has a narrow continuous annular extension 38' which surrounds input emitter mesa 22. Extension 38' serves to space input emitter mesa 22 from the circumscribing etch moat 26. Input emitter mesa 22 has an interdigitated vacuum evaporated aluminum electrode 40 that extends down from the top of the input emitter mesa 22 to also form electrode 40' on output base section 38. Electrode portion 40' thus surrounds and is interdigitated with output emitter mesa 24. A vacuum evaporated aluminum electrode 42 is on top of output emitter mesa 24, and interdigitated with the surrounding output base electrode portion 40'. A filamentary terminal wire 44 is pressure bonded by ultrasonic or thermocompression bonding techniques to electrode 42 on top of output emitter mesa 24.

The input bleeder resistor for this device is between base portion 30 and base portion 38 through layer 18 underneath emitter mesa 22. This provides a relatively high value resistor as is desired for proper turn on of transistor $Q_1$. As stated, the desired current flow path for this resistor lies between the two emitter mesas 22 and 24. In order to insure that this is the principal current flow path, input emitter mesa extensions 46 and 46′ are used to increase the electrical resistance along output base portion 38′. Thus, leakage current between output base portion 38′ and input base portion 30 is negligible. If desired, arms 46 and 46′ can be eliminated and the latter resistance path be used as a parallel input bleeder resistor. However, the width of mesa 22 adjacent output base portion 38 would have to be considerably increased to obtain the high resistance value desired, and tolerances more carefully observed. We have found that use of input emitter mesa extensions 46 and 46′ are much more satisfactory for commercial manufacturing conditions.

The output bleeder resistance should be of a lower value, as previously mentioned. It is provided by means of parallel resistors $R_2$ and $R_2'$ through layer 18 beneath output emitter mesa 24 to the output base portion 38. Output emitter mesa 24 has two recesses, or apertures 48 and 48′. Apertures 48 and 48′ form windows within mesa 24 through which electrical contact can be made to stratum 18. Base stratum 18 is exposed in these windows when diffusion stratum 20 is formed. Hence, a portion of stratum 20 is present in windows 48 and 48′ to enhance electrical contact to base stratum 18 exposed in the windows.

Electrode 42 on top of output emitter mesa 24 is a blanket coating which also extends down to the P-type material of base stratum 18 exposed in the windows. This produces parallel bleeder resistors $R_2$ and $R_2'$ between the windows and output base portion 38 through stratum 18 beneath output emitter mesa 24. As previously mentioned, the output bleeder resistance should be lower than the input bleeder resistance. However, in our device both resistances are formed in semiconductor material of the same resistance value. Accordingly, two parallel resistance paths are provided in the output section $Q_2$. Hence, the total resistance is less. It is appreciated that only a single window, forming a single resistor, is all that is necessary. However, such a construction would require a much closer tolerance, which in turn may lead to higher yield losses in the finished product. Accordingly, we prefer to use a construction with parallel resistors to reduce the tolerance required to produce the device, tending to lead to a more economical and reliable product.

While this device has been described in connection with an NPN device, it is to be appreciated that the principles of this invention are equally applicable to PNP devices too. Further, while this invention has been described in connection with layers of specific resistivities for optimum current and voltage characteristics, it is equally applicable to devices of other resistivities where optimum current and voltage characteristics are not desired. Analogously, it is to be understood that the thicknesses for the various strata in this device can be modified to suit applications where either higher current or higher voltage is desired.

We claim:

1. A high voltage and high current integrated circuit of cascaded common collector mesa emitter transistors and bleeder resistors that resists secondary breakdown under base widening conditions, said integrated circuit comprising a wafer of a high resistivity semiconductive material of one conductivity type having two major faces and a circumferential edge surface, a first stratum of low resistivity semiconductor material of said one conductivity type coextensive with one face of said wafer and intersecting said edge surface, a second stratum of semiconductive material coextensive with the opposite face of said wafer, said second stratum being of opposite conductivity type and intersecting said edge surface, mesas of said one conductivity type and of equal height on said second stratum, one mesa being generally annular and surrounding a first surface portion of said second stratum to provide an input bleeder resistor thereunder, another mesa spaced from said second mesa, a second surface portion of said second stratum completely surrounding both of said mesas, an aperture in said other mesa surrounding a third portion of said second stratum, each of said surface portions of said second stratum being lower resistivity surface regions of said opposite conductivity type second stratum, a first electrode contacting said first surface portion, a second electrode on both said one mesa and said second surface portion, said second electrode encircling said other mesa, a third electrode on both said other mesa and said third surface portion exposed within said other mesa, said third electrode providing an integral output bleeder resistor under the periphery of said mesa between said second and third surface portions, an etch moat on said opposite wafer surface spaced inwardly from said wafer edge surface and circumscribing said mesas, surface portions and electrodes, said etch moat spaced outwardly from said mesas and extending down entirely through said second stratum, dimensional impedance means on said second surface portion of said second stratum on opposite sides of said one mesa and cooperating with said etch moat and said one mesa for restricting current flow through said second surface portion along said opposite sides of said one mesa, and a fourth electrode on said one face of said wafer.

2. The integrated circuit as described in claim 1 wherein the dimensional impedance means for restricting current flow through said second surface portion of said second stratum along the opposite sides of said one mesa includes extensions of said one mesa partially around said other mesa closely spaced from said etch moat to provide a narrow extended current flow path between said parts of said second surface portion.

3. A high voltage and high current integrated circuit of cascaded common collector mesa emitter transistors and bleeder resistors that resists secondary breakdown under base widening conditions and is adapted to facilitate wire bonding to a recessed base input, said integrated circuit comprising a wafer of a high resistivity semiconductive material of one conductivity type having two major faces and a circumferential edge surface, a first stratum of low resistivity semiconductor material of said one conductivity type coextensive with one face of said wafer and intersecting said edge surface, a second stratum of semiconductive material coextensive with the opposite face of said wafer, said second stratum being of opposite conductivity type and intersecting said edge surface, three mesas of said one conductivity type and of equal height on said second stratum, the first mesa being surrounded by a first surface portion of said second stratum, the second mesa being generally annular and surrounding said first surface portion, the third mesa spaced from said second mesa, a second surface portion of said second stratum surrounding said second and third mesas, an aperture in said third mesa surrounding a third surface portion of said second stratum, each of said surface portions of said second stratum being lower resistivity surface regions of said opposite conductivity type second stratum, a first electrode on said first mesa and said first surface portion, a second electrode on said second mesa and said second surface portion, said second electrode providing an integral bleeder resistor for said second mesa between said first and second surface portions and encircling said third mesa, a third electrode on said third mesa and said third surface portion, said third electrode providing an integral bleeder resistor for said third mesa between said second and third surface portions, an etch moat on said opposite wafer surface spaced inwardly from said wafer edge surface and circumscribing said mesas, surface portions and electrodes, said etch moat spaced outwardly from said mesas and extending down entirely through said second stratum, a fourth electrode on said one face of said wafer, and separate terminal collections to said first and third electrodes on top of said first and third mesas and said fourth electrode serving as base, emitter, and collector connections, respectively.

4. A high voltage and high current integrated circuit of cascaded NPN common collector mesa emitter transistors and bleeder resistors that resists secondary breakdown under base widening conditions and is adapted to facilitate wire bonding to a recessed base input, said integrated circuit comprising a wafer of high resistivity N-type silicon having two major faces and a circumferential edge surface, a first stratum of P-type silicon coextensive with one face of said wafer and intersecting said edge surface, three mesas of N-type silicon and of equal height on said P-type stratum, the first mesa being surrounded by a first surface portion of said P-type stratum, the second mesa being generally annular and surrounding said first surface portion of said P-type stratum, the third mesa being spaced from said second mesa, a second surface portion of said P-type stratum surrounding said second and third mesas, an aperture in said third mesa surrounding a third surface portion of said P-type stratum, each of said surface portions of said P-type stratum being lower resistivity surface regions of P-type conductivity, a first electrode on said first mesa and said first surface portion, a second electrode on said second mesa and said second surface portion, said second electrode providing an integral bleeder resistor for said second mesa between said first and second surface portions and encircling said third mesa, a third electrode on said third mesa and said third surface portion, said third electrode providing an integral bleeder resistor for said third mesa between said second and third surface portions, an etch moat on said P-type stratum on said one wafer face spaced inwardly from said wafer edge surface and circumscribing said mesas, surface portions and electrodes, said etch moat spaced outwardly from said mesas and extending down entirely through said P-type stratum, an N-type stratum of lower resistivity silicon coextensive with the opposite face of said wafer and intersecting said wafer edge surface, a fourth electrode on said lower resistivity N-type stratum on said opposite face of said wafer, and serving as base, emitter and collector connections respectively, a filamentary terminal wire bonded to said first electrode on top of said first mesa, a filamentary terminal wire bonded to said third electrode on top of said third mesa, and a terminal bonded to said fourth electrode.

* * * * *